United States Patent [19]

Teymouri et al.

[11] Patent Number: 4,734,593
[45] Date of Patent: Mar. 29, 1988

[54] CML BIAS GENERATOR

[75] Inventors: Sasan Teymouri, Mountain View; Sungil Lee, San Jose, both of Calif.

[73] Assignee: Advanced Micro Devices, Inc., Sunnyvale, Calif.

[21] Appl. No.: 924,655

[22] Filed: Oct. 29, 1986

[51] Int. Cl.$^4$ .......................... H03K 3/01; H03K 3/26
[52] U.S. Cl. .................... 307/297; 307/310; 323/281
[58] Field of Search ............ 307/297, 296 R, 480, 307/551, 310, 555, 567; 323/313, 311, 281

[56] References Cited

U.S. PATENT DOCUMENTS

| | | | |
|---|---|---|---|
| 3,555,309 | 1/1971 | Limberg | 307/297 |
| 3,794,861 | 2/1974 | Bernacchi | 307/297 |
| 3,937,988 | 2/1976 | De Clue et al. | 307/567 |
| 4,061,959 | 12/1977 | Ahmed | 307/297 |
| 4,260,911 | 4/1981 | Brown, Jr. et al. | 307/296 R |
| 4,339,707 | 7/1982 | Gorecki | 307/297 |
| 4,547,881 | 10/1985 | Varadarajan | 307/296 R |

Primary Examiner—Stanley D. Miller
Assistant Examiner—Timothy P. Callahan
Attorney, Agent, or Firm—Patrick T. King; Davis Chin; J. Vincent Tortolano

[57] ABSTRACT

A bias generator for use in CML gate circuits provides an output reference voltage that is substantially independent of variations in supply voltage over a wide temperature range. The bias generator includes a temperature and voltage compensating circuit portion which is formed of an emitter resistor and a diode-connected transistor. The emitter resistor is used to control the output reference voltage for the lower temperatures and the base-emitter voltage of the transistor determines the output reference voltage for the higher temperatures.

7 Claims, 6 Drawing Figures

ECL GATE

CML GATE

| TEMP. | $V_{cc}--$ (+ 4.5 VOLTS) | | $V_{cc}++$ (+ 5.5 VOLTS) | |
|---|---|---|---|---|
| | Ig | SWING | Ig | SWING |
| −55°C | 160.0 ua | 341.9 mv | 218.6 ua | 467.0 mv RTO− |
| | 116.0 | 363.7 | 158.9 | 497.2 RTO+ |
| 0°C | 168.0 | 387.6 | 211.5 | 487.7 |
| | 121.4 | 409.9 | 150.4 | 508.0 |
| 25°C | 165.7 | 402.1 | 196.1 | 476.0 |
| | 119.4 | 424.5 | 139.0 | 494.0 |
| 75°C | 141.2 | 403.9 | 154.1 | 441.0 |
| | 100.1 | 419.6 | 108.5 | 454.9 |
| 125°C | 112.3 | 374.1 | 120.3 | 401.4 |
| | 78.8 | 385.3 | 84.5 | 411.5 |
| 155°C | 96.6 | 348.0 | 102.9 | 371.8 |
| | 67.46 | 356.7 | 71.6 | 379.4 |

FIG. 5

CML BIAS GENERATOR

BACKGROUND OF THE INVENTION

This invention relates generally to reference voltage generators and more particularly, it relates to a bias generator for use in CML circuits which has an output reference voltage that is substantially independent of variations in supply voltage over a wide temperature range.

As is generally known, conventional emitter-coupled logic (ECL) gate circuits can be constructed of a differential transistor circuit with emitter follower output transistors as shown in FIG. 1(a). When the emitter follower output transistors are eliminated, as is shown in FIG. 1(b), this type of logic gate is sometimes referred to as a current mode logic (CML) gate. Such ECL and CML gate circuits are well suited for high performance products such as electronic computers and other electronic apparatus since the differential transistors are operated out of saturation with relatively small voltage swings. As a result, these circuits have small propagation delays, thereby providing a high speed of operation. Since the emitter follower transistors T3 and T4 are not present in the CML gate circuit of FIG. 1(b), CML gate circuits have generally a smaller power dissipation and a smaller voltage swing than the ECL gate circuits. The conventional ECL gate circuit has a logic swing of approximately 650 mV to 850 mV. However, for the CML gate circuits the logic swing is about 340 mV to 430 mV. In view of the fact that both of these types of circuits have a wide range of applications, it has thus become important to preserve their high performance potential when such circuits are designed and fabricated as integrated circuits.

In order to insure that integrated circuits embodying the ECL gate circuits of FIG. 1(a) achieve maximum performance, a conventional bandgap reference voltage $V_{CS}$ is commonly generated on the same chip and is used to control the base of the main current source transistor T5 which determines the magnitude of the current flowing through the reference transistor T2 or the input transistor T1. The bandgap reference voltage $V_{CS}$ has the characterisitc of being stable and of tracking variations in processing and temperature as well as changes in operating parameters such as temperature. A conventional bandgap circuit has a typical swing which is maintained within 50 mV over the operating temperature, power supply and process variations. However, such conventional bandgap reference voltage generators have the disadvantage of being susceptible to oscillations. While this oscillation problem can be overcomed with the use of a capacitor, such a requirement is generally an undesirable addition to an integrated circuit since it entails the use of a relatively large amount of chip area. A prior art bandgap generator as just described is illustrated in FIG. 2. As can be seen this bandgap generator circuit suffers further from the disadvantage of requiring the use of a relatively high number of circuit components, thereby increasing power consumption and manufacturing costs.

While the modified prior art bandgap reference circuit of FIG. 2 could be used to adequately generate the reference voltage $V_{CS}$ of FIG. 2(b), it would be more expedient to provide a bias generator for the CML gate circuit which avoids the possibility of oscillations, eliminates the needs of the feedback capacitor, and contains a reduced number of circuit elements for constructing the circuit. To the best of the inventor's knowledge, no one has heretofore developed a bias generator for CML gate circuits which is of a relatively simple construction as in the present invention.

SUMMARY OF THE INVENTION

Accordingly, it is a general object of the present invention to provide a bias generator for CML gate circuit which is relatively simple and economical to manufacture and assemble, but yet overcomes the disadvantages of the prior art.

It is an object of the present invention to provide a bias generator for CML gate circuits which has an output reference voltage that is independent of variations in the supply potential over a wide range of temperature.

It is another object of the present invention to provide a bias generator for CML gate circuits which is unsusceptible to oscillations.

It is still another object of the present invention to provide a bias generator for CML gate circuits which uses a reduced number of circuit components.

It is yet still another object of the present invention to provide a bias generator for CML gate circuits which eliminates the need of a capacitor, thereby occupying less chip area.

In accordance with these aims and objectives, the present invention is concerned with the provision of a bias generator circuit for use with current mode logic gates which has an output reference voltage that is substantially independent of supply potential and temperature variations. The bias generator circuit includes a first transistor and a second transistor. The first transistor has its collector connected to a supply potential via a first load resistor. The second transistor has its collector connected to the supply potential via a second load resistor and its base connected to the collector of the first transistor. The second transistor has its emitter coupled to an output node for generating an output reference voltage and connected to the base of the first transistor via an impedance compensating resistor. A compensating circuit portion is coupled to the emitter of the first transistor for minimizing variations in the output reference voltage as a function of changes in the supply potential and temperature. The compensating circuit portion is formed of a first emitter resistor and a third transistor. A stabilizing circuit portion is coupled to the emitter of the second transistor for maintaining the output reference voltage to be balanced in actual layout of CML gates. The stabilizing circuit portion is formed of a fourth transistor and a second emitter transistor.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 5 is a table which lists the gate current and the swing voltage as a function of temperature and power supply variations.

DESCRIPTION OF THE PREFERRED EMBODIMENT

Figure 1A:
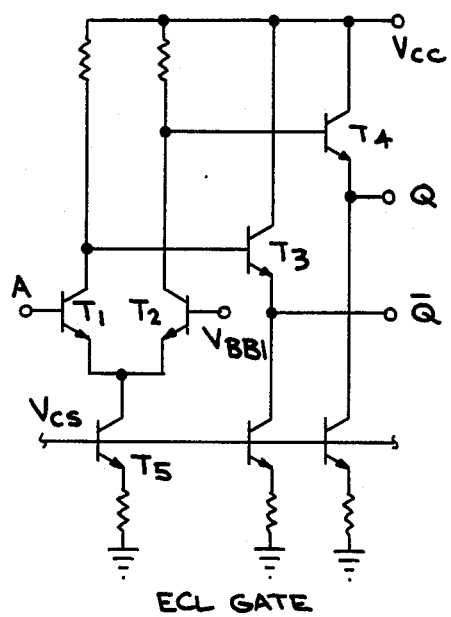
FIG. 1(a) is a schematic circuit diagram of a conventional ECL gate circuit.
Figure 1B:
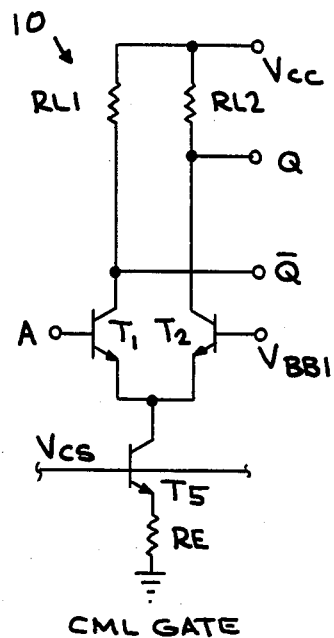
FIG. 1(b) is a schematic circuit diagram of a conventional CML gate circuit.
Figure 2:
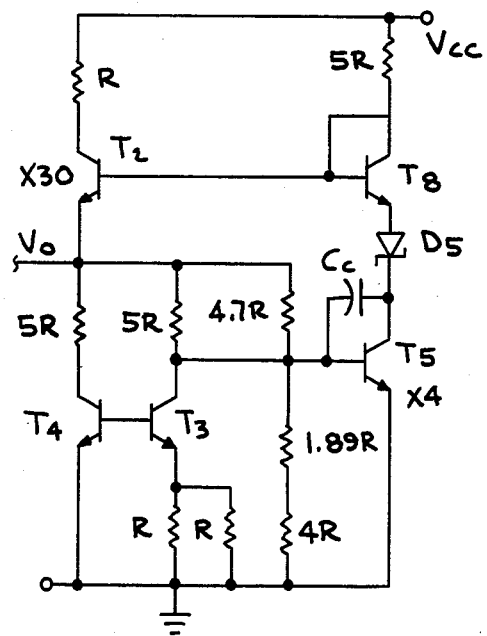
FIG. 2 is a schematic circuit diagram of a bandgap reference voltage generator of the prior art.

Referring now in detail to the drawings, there is shown in FIG. 1(b) a conventional CML gate circuit 10 to which is applied the bias generator 12 (FIG. 3) of the present invention. The gate circuit 10 is formed of an input transistor T1 and a reference transistor T2 whose emitters are connected together. The input transistor T1 has its base connected for receiving an input logic signal A and its collector connected to a supply voltage or potential VCC via a first load resistor RL1. The reference transistor T2 has its base connected for receiving a reference supply voltage VBB1 and its collector connected also to the supply potential VCC via a second load resistor RL2. The supply potential VCC is typically at +5.0 volts. The junction of the resistor RL2 and the collector of the transistor T2 provides a non-inverting output signal Q. The junction of the resistor RL1 and the collector of the transistor T1 provides an inverting output signal $\overline{Q}$ which is a complement of the signal Q. The common emitters of the transistors T1 and T2 are connected to the collector of the main current source transistor T5. The base of the transistor T5 is connected to a stable reference voltage $V_{CS}$ which is produced by the bias generator 12 of the present invention. The emitter of the transistor T5 is connected to a ground potential via an emitter resistor RE which is used to set the gate current.

The logic swing of the input signal A applied to the base of the transistor T1 must not be too high or else it will become saturated. On the other hand, the logic swing must not be too low or else noise margins are reduced. For the resistor values shown the input logic swing of the circuit in FIG. 1(b) is approximately 340 mV at a junction temperature of 155° C. which reduces propagation time delay. Since the reference voltage $V_{CS}$ is used to bias the transistor T5 to control the amount of current flowing through either the reference transistor or the input transistor, it is important that the bias generator which provides the reference voltage $V_{CS}$ avoids saturation of these transistors in order to maintain its high speed of operation. Accordingly, there is a need for a bias generator which provides a reference output voltage $V_{CS}$ that has minimal changes due to temperature, power supply and process variations. The output logic swing at the collector of the transistor T1 or T2 of the CML gate circuit should be maintained within 50 mV over the operating temperature range of −55° C. to +155° C., ±10% power supply fluctuations and process variations. Since the junction temperature of the transistors are normally operating at +155° C., it would be further desirable to design the bias generator to be minimized for variations due to the supply potential at this particular operating temperature.

Figure 3:
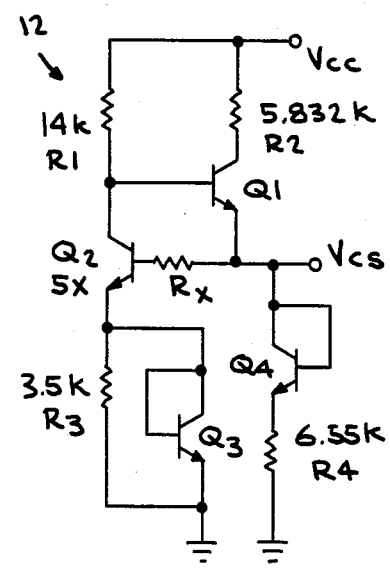
FIG. 3 is a schematic circuit diagram of a CML bias generator of the present invention.

In FIG. 3, there is shown a schematic circuit diagram of a bias generator 12 of the present invention for generating a reference output voltage $V_{CS}$ for the CML gate circuit of FIG. 1(b). The bias generator 12 includes a first transistor Q2 and an emitter follower transistor Q1.

The first transistor Q2 has its collector connected to one end of a first load resistor R1 and to the base of the emitter follower transistor Q1. The collector of the emitter follower transistor Q1 is connected to one end of a second load resistor R2. The other ends of the resistors R1 and R2 are connected to a supply voltage or potential VCC which is typically at +5.0 volts. However, for CML circuits this supply potential is specified as being acceptable if it falls within ±10% of the nominal +5.0 volts. Thus, the supply potential VCC may lie within the range of +4.5 volts and +5.5 volts. The emitter of the transistor Q1 provides the stable reference voltage $V_{CS}$ at an output node and is connected to one end of a compensating resister Rx. The other end of the resister Rx is connected to the base of the first transistor Q2.

The emitter of the first transistor Q2 is connected to a temperature and voltage compensating circuit portion consisting of a resister R3 and a diode-connected transistor Q3. In particular, the emitter of the transistor Q2 is connected to one end of the resister R3 and to the collector and base of the transistor Q3. The other end of the resister R3 and the emitter of the transistor Q3 are connected together and to a ground potential. The emitter of the transistor Q1 is further connected to a stabilizing circuit portion consisting of a series connection of a diode-connected transistor Q4 and an emitter resistor R4. The emitter of the transistor Q1 is connected to the collector and base of the transistor Q4. The emitter of the transistor Q4 is connected to one end of the resistor R4, and the other end of the resistor R4 is connected to the ground potential.

As is generally known, the resister R3 has a positive temperature coefficient while the base-emitter voltage $V_{BE3}$ of the transistor Q3 has a negative temperature coefficient. At the cold temperatures of −55° C. to 20° C., the transistor Q3 is turned off and the positive temperature coefficient of the resistor R3 will control the value of the output reference voltage $V_{CS}$. Further, at a controlled and predefined temperature T, the transistor Q3 will be turned on and thereafter, the negative temperature coefficient of the transistor Q3 will control the value of the output reference voltage $V_{CS}$. This predefined temperature T or break-in point, at which point the negative temperature coefficient of the diode-connected transistor Q3 takes over, can be controlled by selection of the resistance value of the resistor R3. It is generally preferable to select a value of the resistor R3 so that logic swing at the collector of the transistor T2 or T1 of the CML gate circuit due to supply voltage variations is minimized at the highest operating temperature. For the value of 3.5 KiloOhms for the resistor R3, the variation due to the supply potential is approximately 30 mV.

The ratio of the emitter areas of the transistors Q2 and Q3 is set to be 5:1. The emitter area of the transistor Q2 has been selected to be five times the area of load transistor to be connected to the reference voltage $V_{CS}$ at the output node, thereby to compensate partially for the difference in the base-emitter voltages thereof. The transistor Q1 also has five times the emitter area since it is used to furnish the drive current for the load transistors. Thus, by increasing the current capability of the transistor Q1, fan-out ability of the bias generator is improved. The stabilizing circuit portion has been added for design layout purposes. This is used to achieve a balanced voltage at each end where the reference voltage $V_{CS}$ is connected on the integrated circuit.

It is also assumed that the transistors Q1 and Q2 have a common emitter current amplification factor beta (B) which is high. Since the high frequency cut-off (current gain - band width product) $f_T$ of the transistor Q2 is on the order of 2 GHz and will have a negative real impedance, the compensating resister Rx has been added to avoid such negative impedance.

The bias generator circuit of FIG. 3 was built substantially as shown as part of the same monolithic integrated circuit which contained the CML gate circuit of FIG. 1(b) using a standard silicon IC processing. The following representative values were used:

| RESISTOR | VALUE |
|----------|-------|
| R1 | 14 Kilohms |
| R2 | 5.8 Kilohms |
| R3 | 3.5 Kilohms |
| R4 | 6.5 Kilohms |
| Rx | 300 Ohms |

In the CML gate circuit of FIG. 1(b), the load resistors RL1 and RL2 have a value of 2917.5 Ohms and the emitter resistor RE has a value of 4493.0 Ohms.

Figure 4:
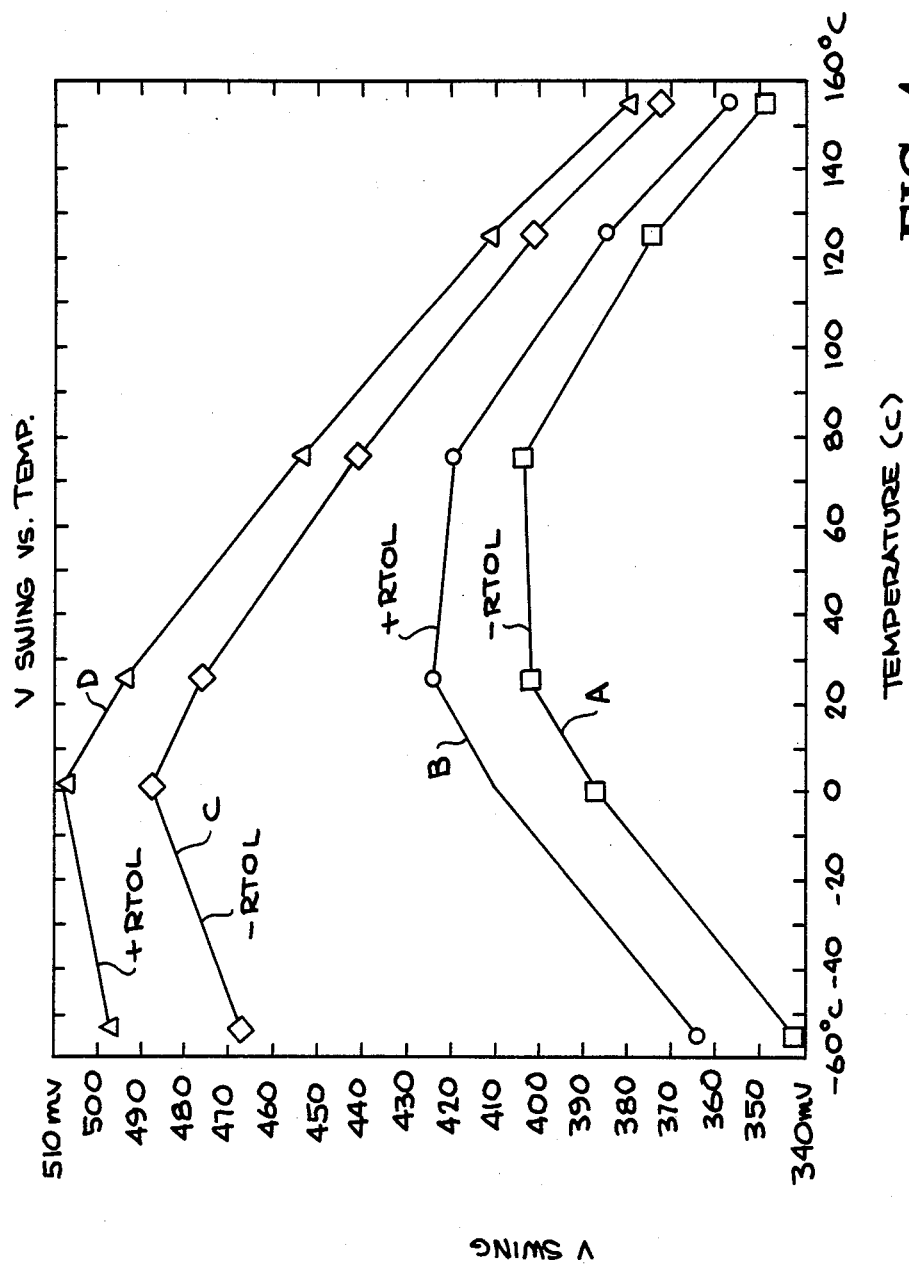
FIG. 4 are graphs illustrating the output logic swings which are useful in explaining the operation of the bias generator of the present invention in FIG. 3.

In FIG. 4, the output logic swing of the CML gate circuit 10 driven by the bias generator 12 of the present invention is shown in the curves A through D as a function of variations in resistor tolerance, supply voltage and temperature. Each of the resistors RL1, RL2 and RE were constructed with a width of 4 microns. The tolerance percentages of the resistance values on resistors RL1 and RL2 were +21.9 and −16.8. The tolerance percentage of the resistance value on the resistor RE were +18.7 and −15.0. The curve A illustrates the output logic swing over the temperature range of −55° C. to +155° C. where the lower tolerance value of the resistors and the lower power supply of +4.5 volts are used. The curve B depicts the output logic swing over the same temperature range but where the higher tolerance values of the resistors and the supply potential of +4.5 volts are used. Further, the curve C shows the output swing over the same temperature range but where the lower tolerance values of the resistors and the higher supply potential of +5.5 volts are used. Finally, the curve D shows the output logic swing over the same temperature range but where the higher tolerance values of the resistors and the higher supply potential of +5.5 volts are used. By looking at the temperature of +155° C., it can be seen that the output swing was held so as to not be variable by more than approximately 30 mV over variations in tolerance and supply potential.

In FIG. 5, there is shown a table which lists the output voltage and gate current over the temperature range. The left side of the table shows the output voltage and gate current when the supply potential is at +4.5 volts, and the right side of the table shows the output voltage and gate current when the supply potential is at +5.5 volts. Further, for each temperature, the top line shows the output voltage and gate current when the resistors in the CML gate circuit have the negative tolerance value, and the bottom line shows the output voltage and gate current when the resistors have the positive tolerance values. Again, for the temperature of +155° C., it can be seen that the output swing varies only between 348 mV and 379.4 mV, or difference of 29.4 mV.

The bias generator circuit of the present invention has the following advantages over the prior art:

(a) It is unsusceptible to oscillations;

(b) It uses a reduced number of circuit components; and (c) It eliminates the need of a capacitor, thereby occupying less chip area.

From the following detailed description, it can thus be seen that the present invention provides a bias generator circuit for use in CML gate circuits which has an output reference voltage that is substantially independent of variations in supply voltage over a wide temperature range. The bias generator includes a resistor for controlling the output reference voltage at the lower temperatures and a diode-connected transistor for controlling the output reference voltage at the higher temperatures.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A bias generator circuit for use with current-mode logic gates which has an output reference voltage that is substantially indepenent of supply potential and temperature variations, said generator circuit comprising:

a first transistor having its collector connected to the supply potential via a first load resistor;

a second transistor having its collector connected to the supply potential via a second load resistor and its base connected to the collector of said first transistor;

said second transistor having its emitter coupled to an output node for generating an output reference voltage and connected to the base of said first transistor via an impedance compensating resistor;

compensating means coupled to the emitter of said first transistor for minimizing variations in said output reference voltage as a function of changes in the supply potential and temperature;

said compensating means being formed of a first emitter resistor and a diode-connected third transistor, said first emitter resistor having its one end connected to the emitter of said first transistor and to the collector and base of said third transistor, the emitter of said third transistor being connected to the other end of said first emitter resistor and to a ground potential;

the value of the first emitter resistor controlling the output reference voltage for lower temperatures and the base-emitter voltage of the third transistor controlling the output reference voltage for higher temperatures;

stabilizing means coupled to the emitter of said second transistor for maintaining the output reference voltage to be balanced; and said stabilizing means being formed of a fourth transistor and a second emitter resistor, said fourth transistor having its collector and base connected to the emitter of said second transistor and its emitter connected to one end of said second emitter resistor, the other end of said second emitter resistor being connected to the ground potential.

2. A bias generator circuit as claimed in claim 1, wherein said bias generator circuit is formed as a part of a monolithic integrated circuit.

3. A bias generator as claimed in claim 1, wherein the ratio of the emitter areas of said first and third transistors is 5:1.

4. A bias generator as claimed in claim 3, wherein the ratio of the emitter areas of said second and third transistors is 5:1.

5. A bias generator as claimed in claim 1, wherein the output reference voltage is substantially constant with ±10% variations in the supply potential over the temperature range of −55° C. to +155° C.

6. A bias generator circuit as claimed in claim 1, wherein said first and second transistors are NPN bipolar transistors.

7. A bias generator circuit as claimed in claim 1, wherein all of the transistors are NPN bipolar transistors.

* * * * *